(12) United States Patent
Pan et al.

(10) Patent No.: US 7,948,006 B2
(45) Date of Patent: May 24, 2011

(54) PHOTODIODE WITH HIGH ESD THRESHOLD

(75) Inventors: Zhong Pan, San Jose, CA (US); David Venables, Sunnyvale, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 232 days.

(21) Appl. No.: 12/476,070

(22) Filed: Jun. 1, 2009

(65) Prior Publication Data

US 2010/0301441 A1 Dec. 2, 2010

(51) Int. Cl.
*H01L 23/60* (2006.01)

(52) U.S. Cl. ........ 257/173; 257/452; 257/458; 257/656; 257/459; 257/461; 257/E31.061; 257/E29.336; 257/E31.11

(58) Field of Classification Search .................. None
See application file for complete search history.

(56) References Cited

U.S. PATENT DOCUMENTS

| | | | |
|---|---|---|---|
| 6,753,214 B1 * | 6/2004 | Brinkmann et al. | 438/184 |
| 6,835,984 B2 | 12/2004 | Derkits, Jr. et al. | 257/355 |

OTHER PUBLICATIONS

Sun et al., "Nonlinearity in ESD robust InGaAs p-i-n photodiode" published in IEEE Transactions on Electron Devices, vol. 52, Issue 7, pp. 1508-1513, Jul. 2005.

* cited by examiner

*Primary Examiner* — Minh-Loan T Tran
*Assistant Examiner* — Fei Fei Yeung Lopez
(74) *Attorney, Agent, or Firm* — Matthew A. Pequignot; Pequignot + Myers LLC

(57) ABSTRACT

A photodetector with an improved electrostatic discharge damage threshold is disclosed, suitable for applications in telecommunication systems operating at elevated data rates. The photodetector may be a PIN or an APD fabricated in the InP compound semiconductor system. The increased ESD damage threshold is achieved by reducing the ESD induced current density in the photodetector by a suitable widening of the contact at a critical location, increasing the series resistance and promoting lateral current spreading by means of a current spreading layer.

15 Claims, 11 Drawing Sheets

PHOTODIODE WITH HIGH ESD THRESHOLD

TECHNICAL FIELD

The present invention relates to photodetectors, and more particularly, to their protection against electrostatic discharge.

BACKGROUND OF THE INVENTION

Photodiodes or photodetectors including PINs and avalanche photodiodes (APDs) are widely used in fiberoptic and optical applications to convert received light into an electrical current signal. The photodiodes require a fast response time to be able to operate in high speed data transmission systems.

Photodiodes with a fast response time as used in such high speed signal transmission are especially vulnerable to damage from electrostatic discharge (ESD). The susceptibility of an electronic component to ESD is measured in terms of an ESD threshold. The higher the threshold, the more robust the component is against damage.

Typically the bandwidth of a photodiode is limited by the product of its capacitance and series resistance, known as its RC constant. In most photodiodes the capacitance of the p-n junction or junction capacitance is the main contributor to the total capacitance. Thus, to achieve a high bandwidth, it is necessary to reduce the junction capacitance by making the photodiode active area as small as possible.

However, in general, the ESD threshold is proportional to the size of the active area. The smaller the active area, the lower the ESD threshold and the more vulnerable is the photodiode to ESD damage. For photodiodes with a speed capability above 2.5 Gbps, the typical ESD threshold is below 50 Volt. The low ESD threshold is a very serious issue to photodiode manufacturing. It results in a low assembly yield even when high cost ESD protection equipment and procedures are implemented.

FIG. 1a is a plan view of the schematic structure of a typical p-i-n photodiode 100 fabricated as a chip from a wafer substrate. In III-V compound semiconductor systems, such as indium phosphide (InP), indium gallium arsenide (InGaAs), gallium arsenide (GaAs) and similar, the p-i-n structure is epitaxially grown on either n-doped or semi-insulating substrate. For operation at wavelengths of interest to fiberoptic telecommunications, InP is a preferred substrate material.

A p-region 1 with periphery 1a is formed by a localized p-type dopant diffusion process through a diffusion mask. Typically zinc (Zn) is used as the p-type dopant. The surface of the p-i-n photodiode 100 is passivated with a dielectric insulating layer 5, typically silicon nitride ($SiN_x$).

To make a contact with the anode of the photodiode, an annular metal contact ring 2 is deposited through an annular opening or via 6 in the insulating layer 5 inside the periphery of the p-region 1. The metal contact ring 2 is annular to permit optical light signals 8 to enter from the front of the photodiode 100. The width of the metal contact ring 2 is made as small as possible to maximize the optically sensitive area of the photodiode 100, which corresponds to the inner diameter of the metal contact ring 2. Titanium/platinum/gold (Ti/Pt/Au) is a suitable metal combination for the metal contact ring 2.

A bond pad 3 for making an external connection to the photodiode anode with a wire bond is deposited on the dielectric insulating layer 5, connected to the metal contact ring 2 by a metal connecting link 4. Arrows A-A' indicate the location of a cross-section of the photodiode shown in FIG. 1b.

With reference to FIG. 1b, in the p-i-n photodiode 100 an InP substrate 10 supports an n-type layer structure comprising a n-doped InP buffer layer 11 0.3-1.0 µm thick, an unintentionally doped InGaAs absorption layer 12 0.8-4 µm thick, and a n-doped or unintentionally doped InP window layer 13. A p-n junction 1b is formed in the absorption layer 12 by the localized p-type dopant diffusion process to form the p-region 1.

The metal contact ring 2 is generally deposited on a thin highly-doped p-type InGaAs layer 7 to lower the contact resistivity, thereby reducing the photodiode series resistance.

A contact to the cathode of the photodiode (not shown) is usually deposited on the bottom of the InP substrate 10 in the case where it is of a conducting n-type. Alternatively, if the InP substrate 10 is semi-insulating, a cathode connection can be made to the n-type layers from the top of the photodiode.

Photodiode structures have been disclosed in prior art that aim at increasing the ESD threshold.

Derkits, Jr. et al. (U.S. Pat. No. 6,835,984 "ESD resistant device") disclose a semiconductor device such as a photodetector electrostatic discharge (ESD) protection structure. A dielectric layer is disposed on the active region layer, and a metal active region contact is disposed in the dielectric layer above the active region and electrically contacting the active region. An annular metal guard ring constituting the ESD protection structure is disposed in the dielectric layer around the active region contact, wherein the ESD protection structure electrically contacts the active region layer of the substrate to provide an ESD discharge path for charge on the surface of the dielectric layer.

While the metal guard ring provides a means for discharging surface charge on the larger surface portion of the dielectric layer, it does not provide direct ESD protection for the photodiode anode.

Maoyou Sun and Yicheng Lu have proposed a guard ring structure to improve the ESD threshold of an InGaAs photodiode in a paper "Nonlinearity in ESD robust InGaAs p-i-n photodiode" published in Electron Devices, IEEE Transactions on, vol. 52, Issue 7, pp 1508-1513, 2005. However, the guard ring increases the overall photodiode capacitance which tends to reduce the photodiode bandwidth and linearity.

It is an object of the invention to provide a photodiode structure with an improved ESD damage threshold by lowering the ESD induced current density.

A further object of the invention is to achieve a lower ESD-induced current density by providing a local widening of the ring contact at the intersection of the connection to the bond pad, incorporating a low conductivity layer to promote lateral current spreading and increasing the series resistance of the photodiode by increasing the contact resistivity of the anode contact.

SUMMARY OF THE INVENTION

A photodiode with an increased ESD threshold is disclosed, comprising an n-type InP buffer layer supported on an upper surface of an InP semiconductor substrate, an intrinsic InGaAs absorption layer on the buffer layer for absorbing light incident on the top surface of the photodiode, an InP window layer on the absorption layer for transmitting the incident light to the absorption layer, and a $SiN_x$ dielectric layer on the window layer for providing passivation.

A circular p-type region extending from a top surface of the window layer into the absorption layer forms a p-n junction therein, with an annular metal contact on the window layer within the periphery of the circular p-type region for making a contact with the p-type region through a contact region. A bond pad on the dielectric layer is provided, remote from the p-type region, for making an external connection to the photodiode, and a metal link connects the bond pad to the annular metal contact.

The contact region comprises an annular section and an expanded section at the intersection of the metal link and the annular metal contact. The expanded section has an area at least twice that of the annular section of the contact region.

BRIEF DESCRIPTION OF THE DRAWINGS

The invention will be described in greater detail with reference to the accompanying drawings which represent preferred embodiments thereof, wherein.

DETAILED DESCRIPTION

A top-entry or front-entry photodiode structure is disclosed which overcomes the shortcomings of prior art devices mentioned above while achieving an improved higher electrostatic discharge (ESD) threshold. The photodiode may be a PIN, an APD or similar photodetector.

Figure 1A:
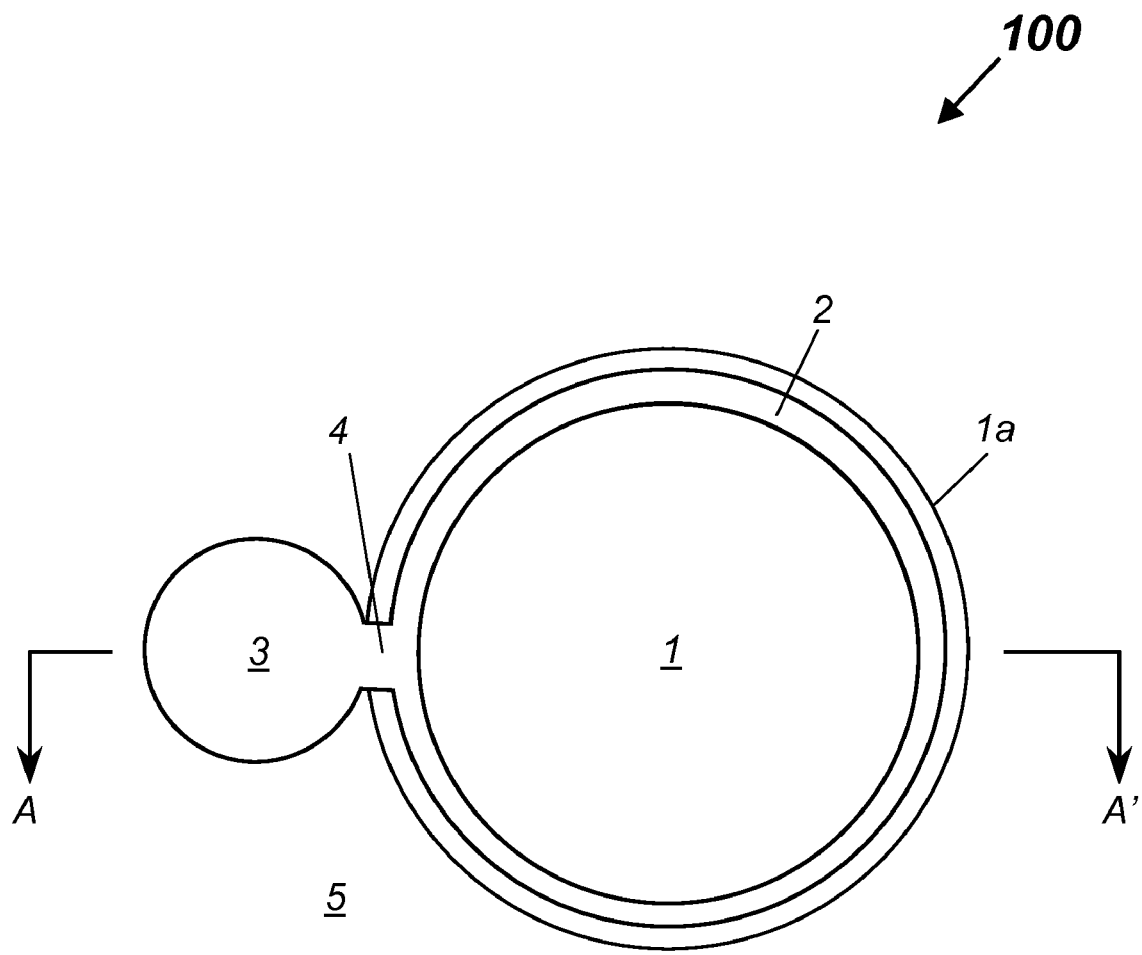
FIGS. 1a and 1b are a top view and a schematic cross-section, respectively, of a prior art conventional p-i-n photodiode.
Figure 1B:
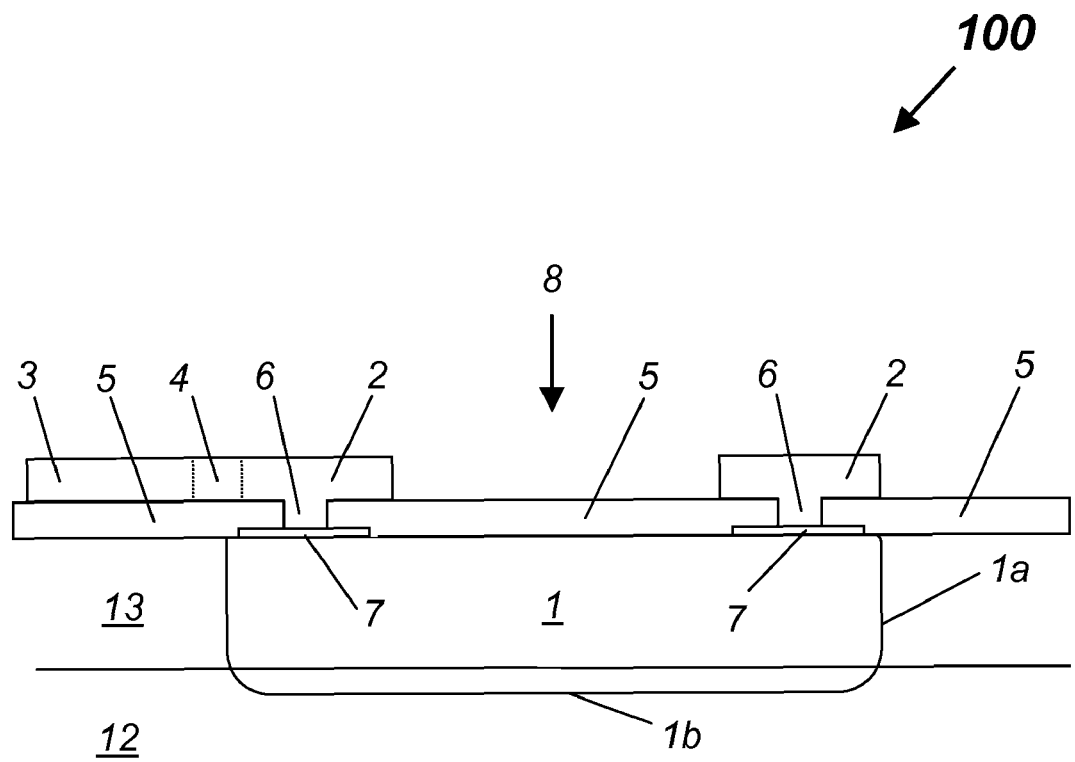
Figure 2A:
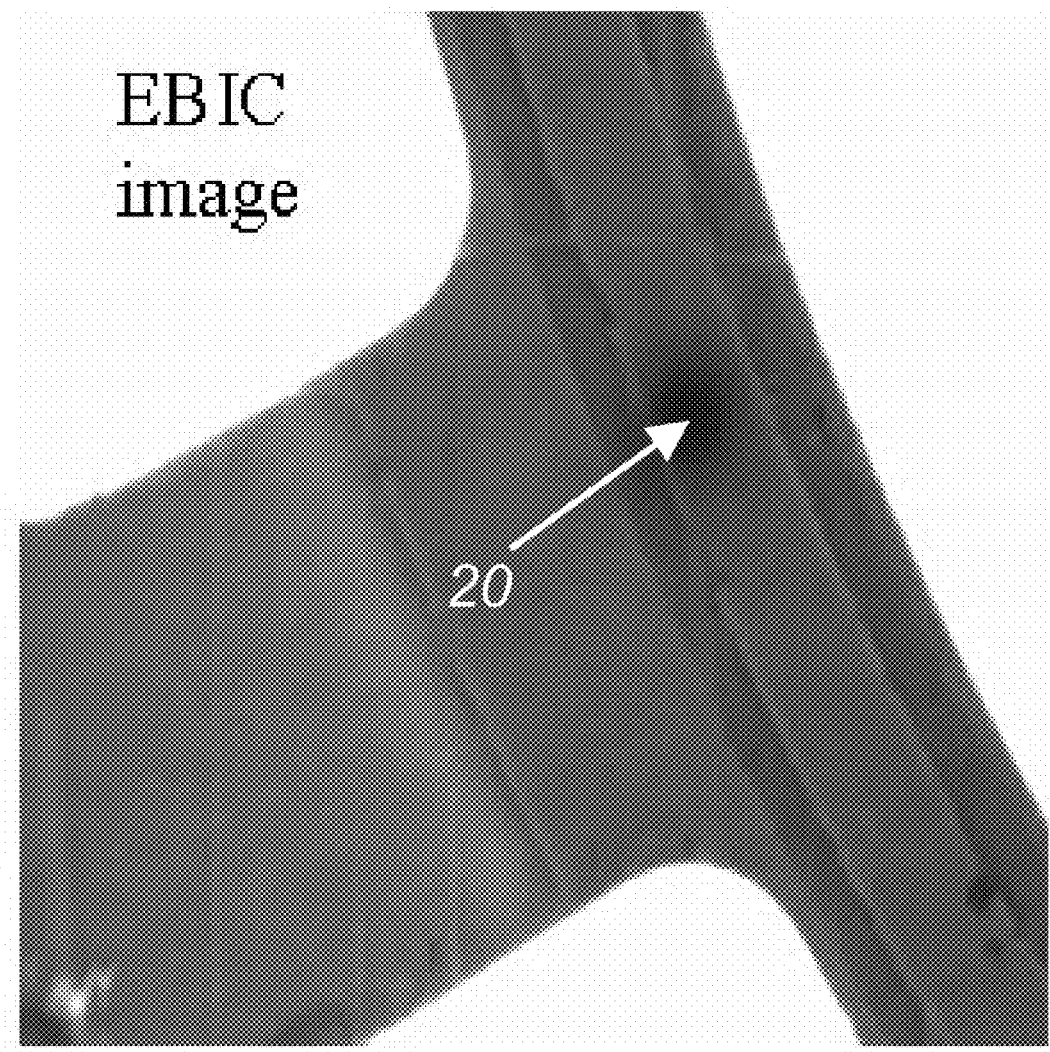
FIGS. 2a and 2b are EBIC and SEM images, respectively, of ESD damage to a photodiode at the intersection area of the contact ring and the connecting link to the bond pad.
Figure 2B:
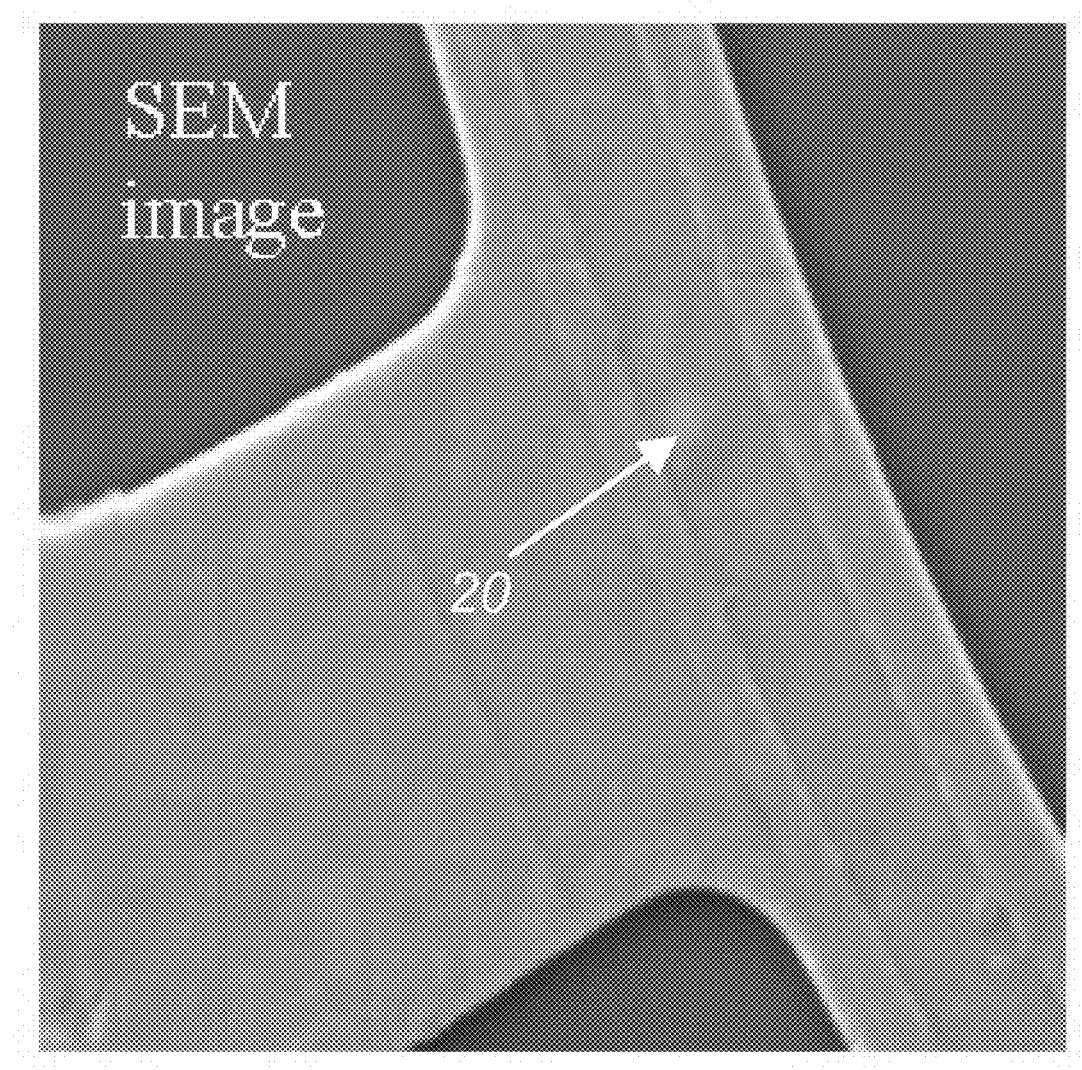

Experiments have shown that the ESD damage is typically localized at the intersection of the remote anode bond pad 3 and the contact ring 2 where a current pulse is injected during an electrostatic discharge event. FIG. 2a shows an example where ESD damage 20 is evident in an electron beam induced current (EBIC) image taken in a scanning electron microscope (SEM), as well as a conventional SEM surface image (FIG. 2b) of the same area. A high current density generated by the ESD current pulse leads to localized melting and subsequent recrystallization of the semiconductor underneath the contact ring 2. This damage results in a high leakage current which compromises the operation of the device.

A low contact resistance and small contact area enhance the speed of the photodiode 100, but also lead to localized high current density, especially at the intersection of the remote anode bond pad 3 and contact ring 2. Therefore, an effective way to improve the ESD resistance is to reduce the peak current density.

According to the present invention, structural details for reducing the high current density generated by the ESD current pulse are disclosed. Basically, the peak current density can be reduced by incorporating in a photodiode one or more of the following:

(1) a high contact resistance metallization;
(2) a separate current spreading layer; and
(3) a locally increased contact area.

To improve the ESD threshold of a photodiode, these structural details may be incorporated either separately or in combination.

Figure 3A:
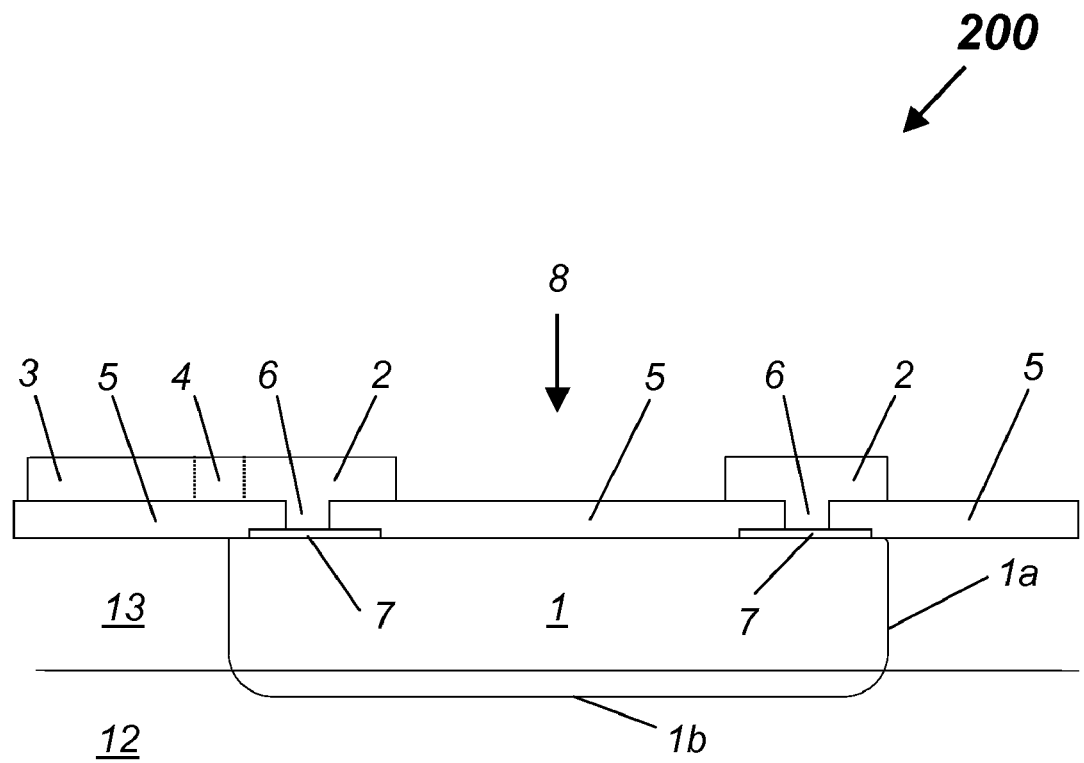
FIGS. 3a and 3b are schematic cross-sections of a p-i-n photodiode according to the present invention with Ti/InGaAs and AuZn/InP contact interfaces, respectively.

A first embodiment of a p-i-n photodiode 200 is shown as a cross-section in FIG. 3a.

The p-i-n photodiode 200 a substrate 10 supports an n-type layer structure comprising a n-doped buffer layer 11 0.3-1.0 µm thick, an unintentionally doped absorption layer 12 0.8-4 µm thick, and a n-doped or unintentionally doped window layer 13. The window layer 13 may comprise a lowly doped p-type semiconductor layer with a p-doping level less than $1 \times 10^{17}$ cm$^{-3}$. Alternatively, it may comprise a compensated layer with high resistance, such as a grown-in n-type layer with a doping level in the range $1 \times 10^{17}$ to $5 \times 10^{17}$ cm$^{-3}$. As the doping of this n-type layer is just slightly lower than the p-doping produced through a p-region diffusion process, it becomes a compensated layer after the p-region diffusion.

A p-n junction 1b is formed in the absorption layer 12 by a localized p-type dopant diffusion process to form the p-region 1 with periphery 1a. Typically zinc (Zn) is used as the p-type dopant for diffusion. Within the diffused p-region 1, the incipient doping of the window layer 13 and of an upper portion of the absorption layer 12 becomes p-type doped. Outside the diffused p-region 1, the doping of the window layer 13 and of an the absorption layer 12 remains essentially unchanged.

The surface of the p-i-n photodiode 200 is passivated with a dielectric insulating layer 5, typically silicon nitride (SiN$_x$).

In III-V compound semiconductor systems, such as indium phosphide (InP), indium gallium arsenide (InGaAs), gallium arsenide (GaAs) and similar, the p-i-n structure is epitaxially grown on either n-doped or semi-insulating substrate. For operation at wavelengths of interest to fiberoptic telecommunications, InP is a preferred material for the substrate 10.

For the same applications, InP is generally used for the buffer layer 11 and the window layer 13. To absorb the optical wavelengths of interest, the absorption layer 12 is preferably InGaAs.

To make a contact with the anode of the photodiode, an annular metal contact ring 2 is deposited through an annular opening or via 6 in the insulating layer 5 inside the periphery of the p-region 1. The metal contact ring 2 is annular to permit optical light signals 8 to enter from the front of the photodiode 200. The width of the metal contact ring 2 is made as small as possible to maximize the optically sensitive area of the photodiode 200, which corresponds to the inner diameter of the metal contact ring 2. Titanium/platinum/gold (Ti/Pt/Au) is a suitable metal combination for the metal contact ring 2.

A bond pad 3 for making an external connection to the photodiode anode with a wire bond is deposited on the dielectric insulating layer 5, connected to the metal contact ring 2 by a metal connecting link 4.

For lower contact resistivity and a reduced series resistance in the photodiode 200, the metal contact ring 2 may make electrical contact to a thin contact layer 7 deposited on top of the window layer 13. Titanium/platinum/gold is a suitable metal system for the metal contact ring 2.

In InP-based devices generally p-type InGaAs is used for the contact layer 7. In typical prior art contact schemes, the Ti/Pt/Au deposited on the p-type InGaAs contact layer 7 is highly doped (greater than $5 \times 10^{18}$ cm$^{-3}$) to form an ohmic Ti/InGaAs interface with the metal contact ring 2. For this purpose, the achievable contact resistivity is smaller than $1\times10^{-5}$ ohm cm$^2$. While such a contact is good for device speed, it not good for lateral current spreading.

However, in this embodiment, the contact resistivity of the metal contact ring 2 is modified in such a way as to maintain a sufficiently low contact resistance to achieve a high speed operation capability of the p-i-n photodiode 200, but high enough for good lateral spreading of electrical current.

Accordingly, the contact resistivity is increased to a range between $1\times10^{-4}$ and $5\times10^{-4}$ ohm cm$^2$. This may be achieved in a number of ways, as illustrated in the following examples.

For the photodiode 200 in FIG. 3a, the contact ring 2 made of Ti/Pt/Au connects to the p-region 1 through the contact layer 7 which has a low doping level that is less than $2\times10^{18}$ cm$^{-3}$.

A contact to the cathode of the photodiode (not shown) is usually deposited on the bottom of the InP substrate 10 in the case where it is of a conducting n-type. Alternatively, if the InP substrate 10 is semi-insulating, a cathode connection can be made to the n-type layers outside the p-region 1 on top of the photodiode 200, for instance the window layer 13 or the contact layer 7.

Figure 3B:
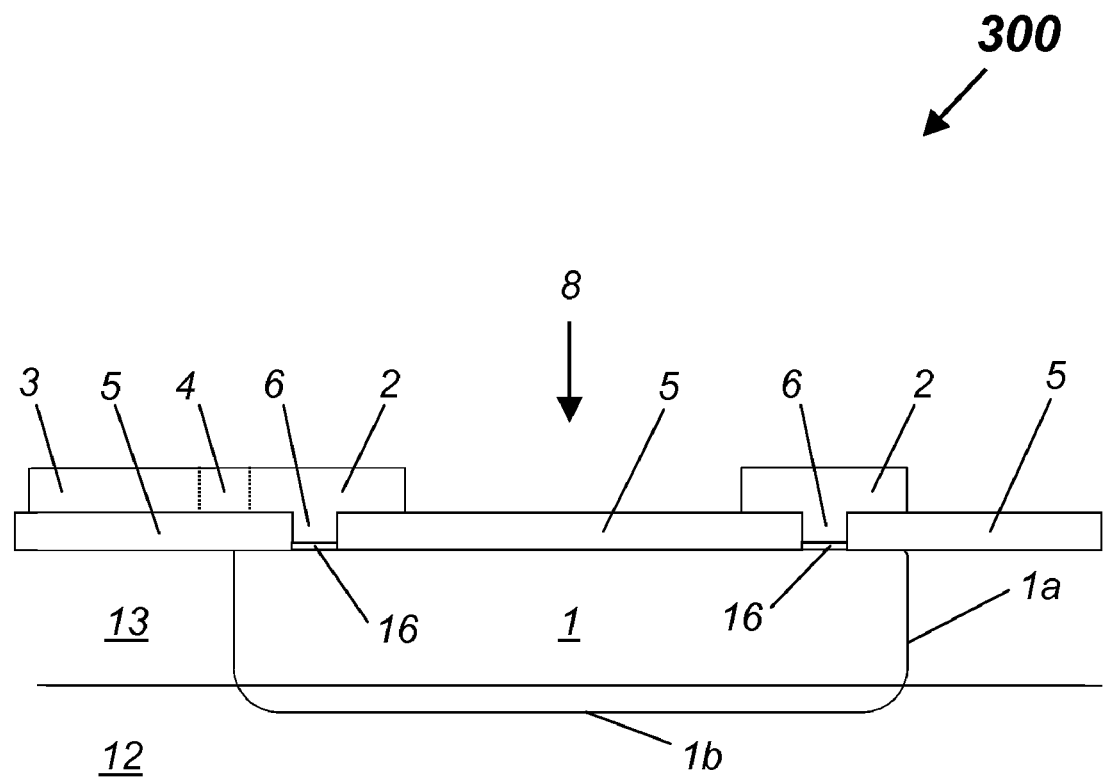

In a second embodiment, the photodiode 300 in FIG. 3b has the contact ring 2 directly contacting the InP window layer 13 within the p-region 1. For this purpose a gold-zinc (AuZn) layer 16 is substituted for the contact layer 7 of the previous embodiment. While the AuZn layer 16 forms an inferior ohmic contact to the InP window layer 13, it will be sufficiently good for high speed operation of the photodiode.

Figure 4:
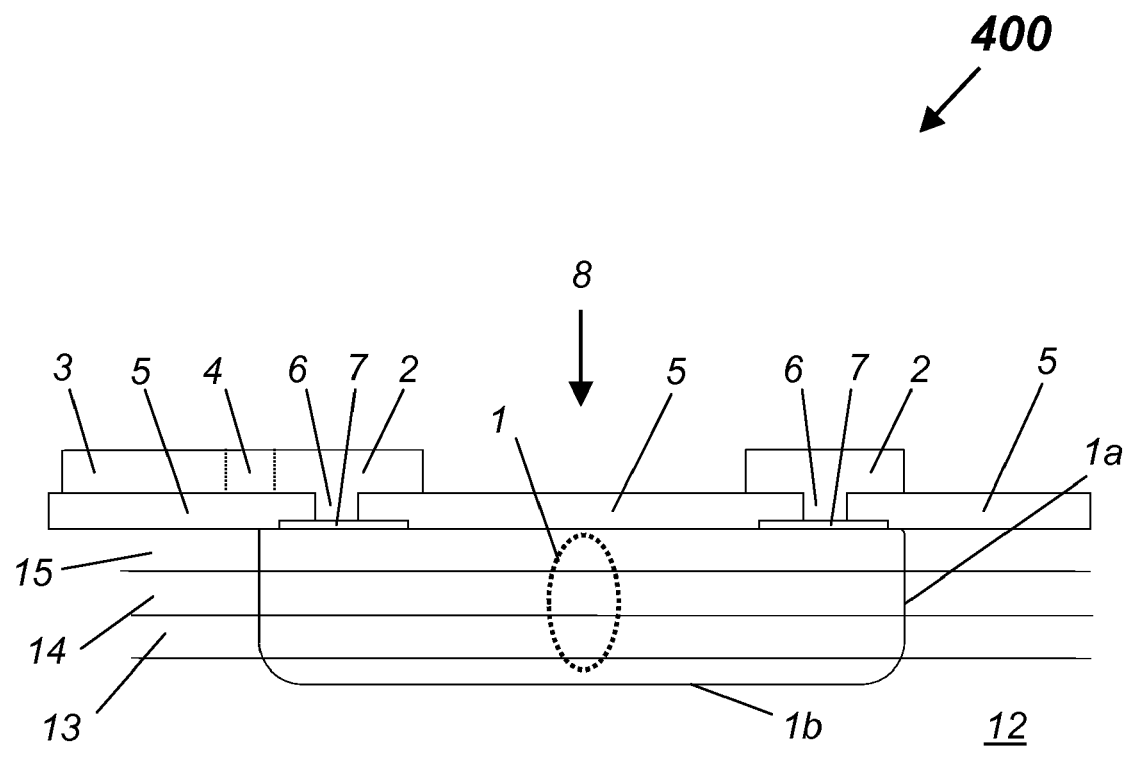
FIG. 4 is a schematic cross-section of a p-i-n photodiode incorporating a current spreading layer according to the present invention.

In a third embodiment, the photodiode 400 in FIG. 4 the window layer 13 of the previous embodiments is subdivided into a lower window layer 13, a current spreading layer 14 and an upper window layer 15. The lower and upper window layers 13 and 15 are either undoped or slightly n-doped to a level of $1\times10^{16}$ to $5\times10^{16}$ cm$^{-3}$ to reduce a dark current of the photodiode 400.

In order to promote a lateral spreading of electrical current flowing from the contact ring 2 toward the buffer layer 11, the current spreading layer 14 is doped higher than the lower and upper window layers 13 and 15. For the current spreading layer 14, the doping level should be in the range of $1\times10^{17}$ to $5\times10^{17}$ cm$^{-3}$, while the thickness should be about 0.2 to 0.5 micron.

To form the p-n junction 1b in the absorption layer 12, the localized p-type dopant diffusion (using, for instance, Zn) extends through the upper window layer 15, the current spreading layer 14 and the lower window layer 13. Within the diffused p-region 1, the incipient doping of the lower and upper window layers 13 and 15, the current spreading layer 14 and an upper portion of the absorption layer 12 becomes p-type. Outside the diffused p-region 1, the doping of the lower and upper window layers 13 and 15, the current spreading layer 14 and an upper portion of the absorption layer 12 remains essentially unchanged.

The metal contact ring 2 makes electrical contact to the thin contact layer 7 deposited on top of the window layer 15. P-type InGaAs with a doping level greater than $5\times10^{18}$ cm$^{-3}$ can be used for the contact layer 7 in conjunction with Ti/Pt/Au for the metal contact ring 2.

Figure 5A:
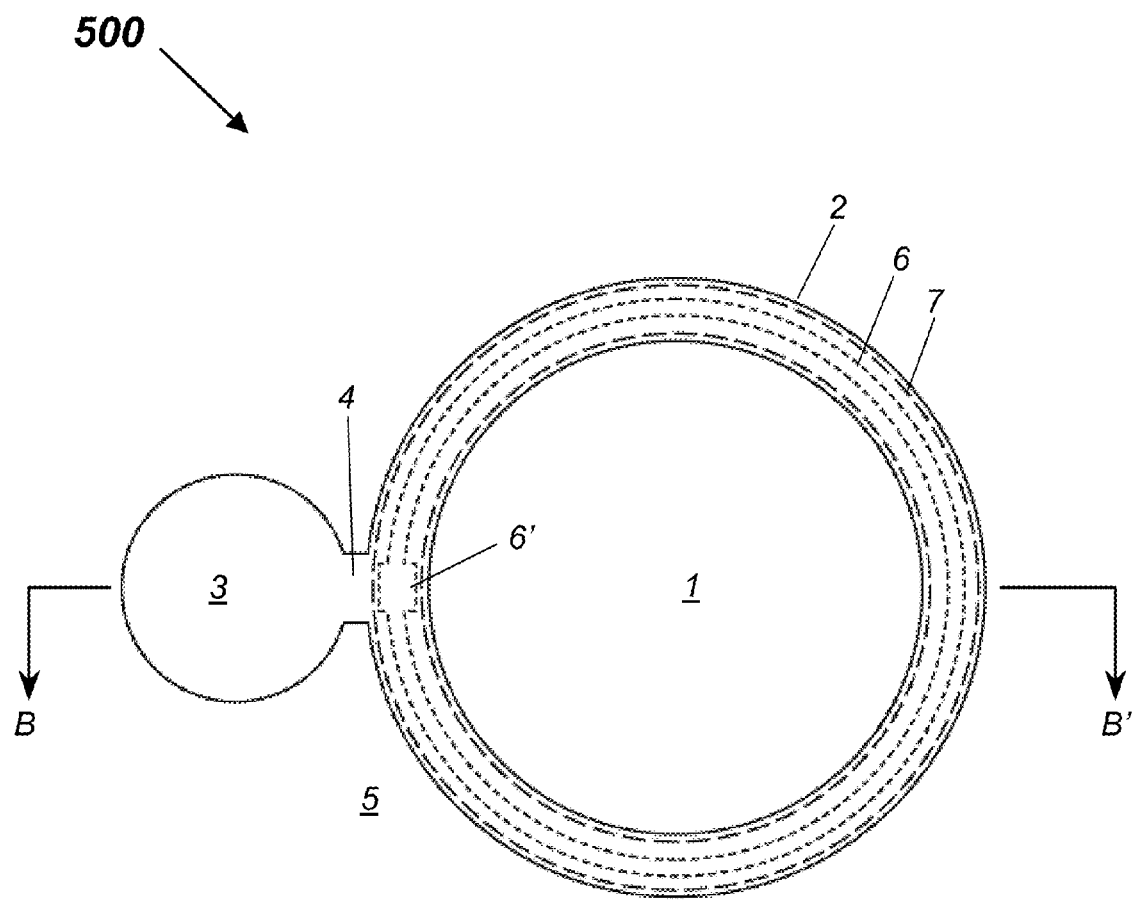
FIGS. 5a and 5b are a top view and a schematic cross-section, respectively, of a p-i-n photodiode according to the present invention, which incorporates a via widening at the intersection of the contact ring and the connection to the bond pad.

A fourth embodiment is shown in FIG. 5a. The structure of photodiode 500 is similar to the previous embodiments, however with an important difference. At the intersection of the annular metal contact ring 2 and the metal connecting link 4, the via 6 through the passivation layer 5 is locally expanded to form an enlarged via intersection region 6'. In this case, the contact layer 7 may retain an annular shape with a constant width of the annulus. Although the via intersection region 6' is shown to have a square shape, other shapes may be used, bearing in mind that shapes with smooth or round edges are preferred to avoid high electric field concentrations.

Figure 5B:
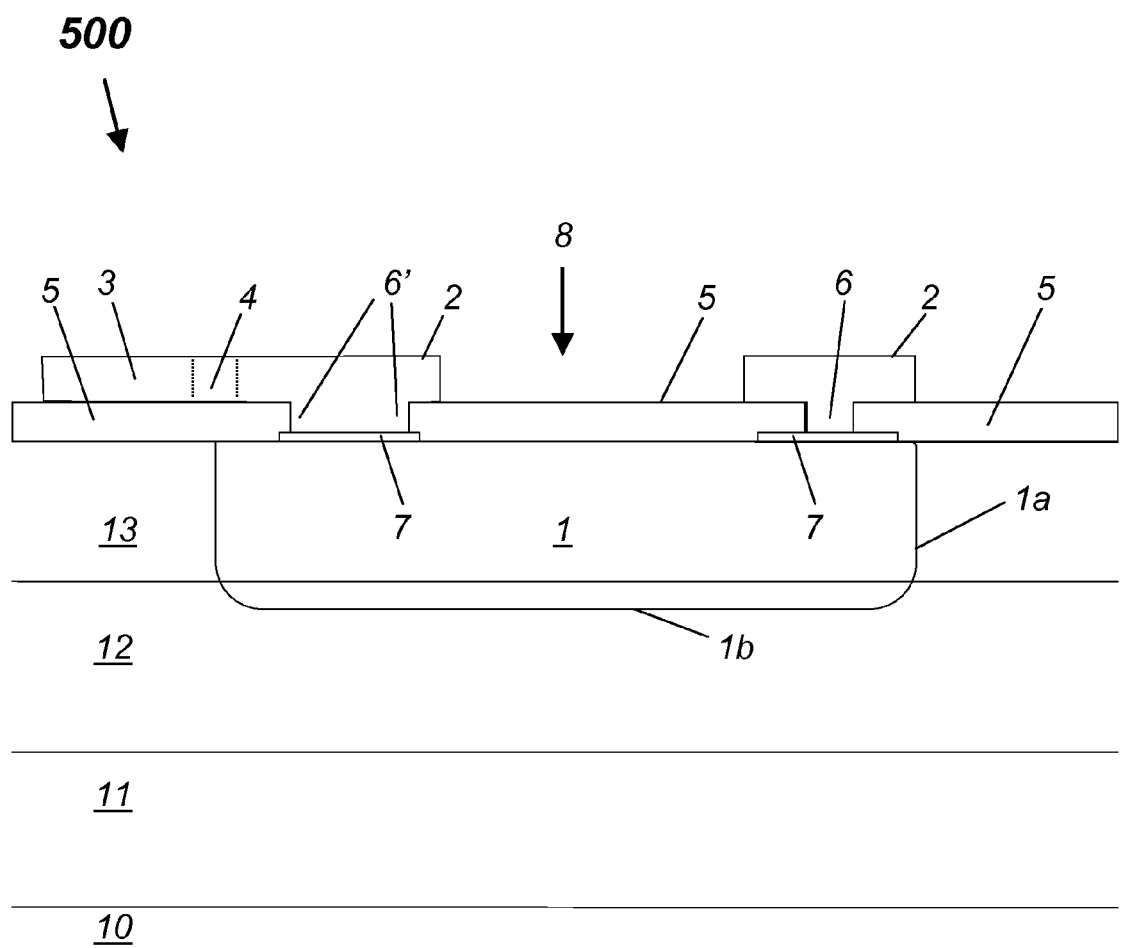

Increasing the area of the via intersection region 6' can effectively reduce the current density at this most vulnerable location of the contact ring 2 of the photodiode 500. The via intersection region 6' is dimensioned to have an area which is two or more times larger than the area of the unexpanded via 6. Arrows B-B' indicate the location of the cross-section of the photodiode 500 shown in FIG. 5b.

A variation of this embodiment may be combined with the second embodiment, where the contact layer 7 is omitted and the metallization of contact ring 2 is changed from Ti/Pt/Au to AuZn in order to increase the contact resistivity of the metal contact ring 2.

Alternatively, the p-doping level of the contact layer 7 may be also be lowered to increase the contact resistivity of the metal contact ring 2.

Figure 6A:
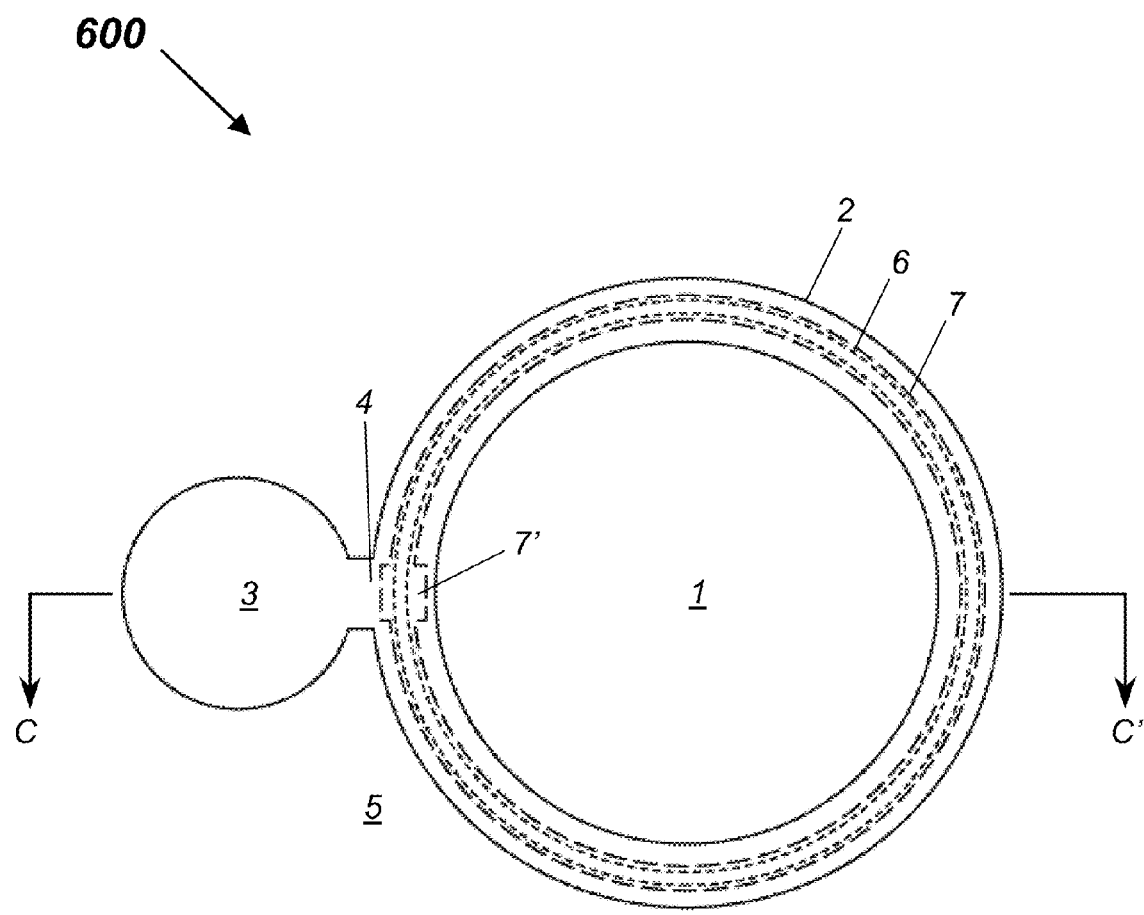
FIGS. 6a and 6b are a top view and a schematic cross-section, respectively, of a p-i-n photodiode according to the present invention, which incorporates a contact layer widening at the intersection of the contact ring and the connection to the bond pad.

In FIG. 6a a fifth embodiment is presented. The photodiode 600 is similar the fourth embodiment, except the via intersection region 6' is replaced by a contact layer intersection region 7', which is a local enlargement of the contact layer 7 at the intersection of the annular metal contact ring 2 and the metal connecting link 4. The contact layer 7 may including the contact layer intersection region 7' may consist of a p-doped InGaAs layer, which can be highly doped if a low contact resistivity is desired.

Analogous to the previous case, the via 6 through the passivation layer 5 may retain an annular shape with a constant width of the annulus.

Here also contact layer intersection region 7' is shown to have a square shape, however other shapes may be used, preferably with smooth or round edges to avoid high electric field concentrations.

Figure 6B:
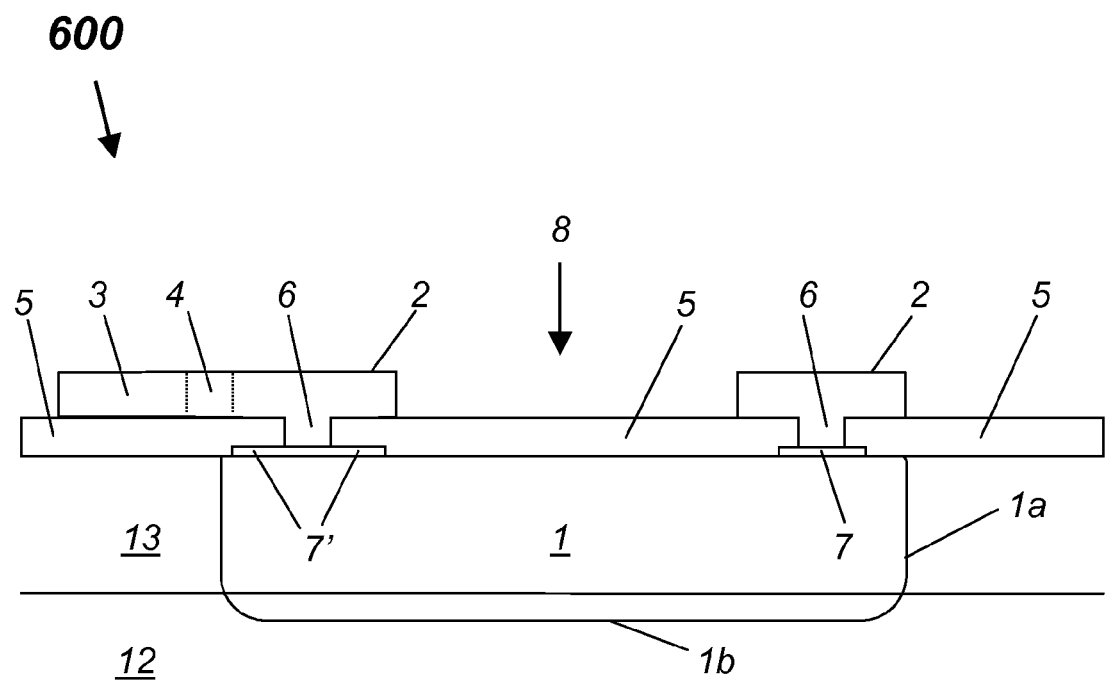

The contact layer intersection region 7' is dimensioned to have an area which is two or more times larger than the area of the unexpanded contact layer 7. Arrows C-C' indicate the location of the cross-section of the photodiode 600 shown in FIG. 6b.

We claim:
1. A photodiode, comprising:
a semiconductor substrate;
an n-type buffer layer supported on an upper surface of the InP semiconductor substrate;
an intrinsic absorption layer on the buffer layer for absorbing light incident on a top surface of the photodiode;
a window layer on the absorption layer for transmitting the incident light to the absorption layer;
a dielectric layer on the window layer for providing passivation;
a circular p-type region extending from a top surface of the window layer into the absorption layer for forming a p-n junction therein;
an annular metal contact on the window layer within the periphery of the circular p-type region for making a contact with the p-type region through a contact region;
a bond pad on the dielectric layer, remote from the p-type region, for making an external connection to the photodiode; and
a metal link connecting the bond pad to the annular metal contact;
wherein the contact region comprises an annular section and an expanded section at the intersection of the metal link and the annular metal contact; and wherein the expanded section has an area at least twice that of the annular section of the contact region.

2. The photodiode of claim 1, wherein the annular metal contact has a contact resistivity between $1\times10^{-4}$ and $5\times10^{-4}$ ohm cm$^2$.

3. The photodiode of claim 1, wherein the semiconductor substrate, the n-type buffer layer, and the window layer comprise InP, and the intrinsic absorption layer comprises InGaAs.

4. The photodiode of claim 3, wherein the contact region comprises a via through the dielectric layer.

5. The photodiode of claim 4, wherein the annular metal contact comprises a gold-zinc alloy.

6. The photodiode of claim 3, wherein the contact region comprises an InGaAs contact layer disposed between the window layer and the annular metal contact.

7. The photodiode of claim 6, wherein the InGaAs contact layer has a doping level less than $2\times10^{18}$ cm$^{-3}$.

8. The photodiode of claim 3, wherein the window layer is doped p-type with a p-doping level less than $1\times10^{17}$ cm$^{-3}$.

9. The photodiode of claim 3, wherein the window layer is doped n-type with a doping level in the range $1\times10^{17}$ to $5\times10^{17}$ cm$^{-3}$.

10. The photodiode of claim 1, wherein the window layer comprises a lower window layer, a current spreading layer for increasing a lateral current flow, and an upper window layer.

11. The photodiode of claim 10, wherein the current spreading layer has a doping level between $1\times10^{17}$ to $5\times10^{17}$ cm$^{-3}$ and a thickness between 0.2 to 0.5 micron.

12. The photodiode of claim 1, wherein the p-type region comprises a diffused zinc doping.

13. The photodiode of claim 1, wherein the dielectric layer comprises silicon nitride.

14. The photodiode of claim 6, wherein the annular metal contact comprises titanium/platinum/gold.

15. The photodiode of claim 6, wherein the InGaAs contact layer has a doping level greater than $5\times10^{18}$ cm$^{-3}$.

* * * * *